United States Patent [19]

Kurihara et al.

[11] Patent Number: 4,932,331
[45] Date of Patent: Jun. 12, 1990

[54] NOVEL SINGLE-BOND CARBON FILM AND PROCESS FOR THE PRODUCTION THEREOF

[75] Inventors: Noriko Kurihara, Kawasaki; Keiko Ikoma, Yokohama; Keiji Hirabayashi, Tokyo; Yasushi Taniguchi, Kawasaki; Susumu Ito, Tokyo, all of Japan

[73] Assignee: Canon Kabushiki Kaisha, Tokyo, Japan

[21] Appl. No.: 257,085

[22] Filed: Oct. 13, 1988

[30] Foreign Application Priority Data

Oct. 16, 1987 [JP] Japan ............................ 57-259576
Oct. 16, 1987 [JP] Japan ............................ 57-259577

[51] Int. Cl.$^5$ .................... C01B 31/00; C09D 1/00
[52] U.S. Cl. .................... 106/286.1; 423/445; 423/446; 428/408
[58] Field of Search .................... 106/286.1; 423/445, 423/446; 427/39; 428/408

[56] References Cited

U.S. PATENT DOCUMENTS

| | | | |
|---|---|---|---|
| 3,961,103 | 1/1976 | Aisenberg | 423/446 |
| 4,504,519 | 3/1985 | Zelez | 423/446 |
| 4,767,608 | 8/1988 | Matsumoto et al. | 423/446 |

OTHER PUBLICATIONS

"Width of the 1332 cm$^{-1}$ Raman Line in Diamond" Stenman-Journal of Applied Physics, vol. 40(10) Sep. 1969.
"On The Synthesis of the Diamomd" Neuhaus-Angewandie Chemie, 66th yr. No. 17/18 Sep. 7, 1954, pp. 25–28.

*Primary Examiner*—Theodore Morris
*Attorney, Agent, or Firm*—Fitzpatrick, Cella Harper & Scinto

[57] ABSTRACT

There is provided a novel single-bond carbonic film, matrix of which comprises carbon atoms and which is characterized by having a peak A at 1340±20 cm$^{-1}$ and a peak B at 1580±10 cm$^{-1}$ in Raman spectrum; a value of 9.7 or more for the ratio of $I_A/I_B$ between the intensity of said peak A($I_A$) and the intensity of said peak B($I_B$): and a value in the range of from 30 cm$^{-1}$ to 110 cm$^{-1}$ for the half band width of said peak A.

11 Claims, 4 Drawing Sheets

NOVEL SINGLE-BOND CARBON FILM AND PROCESS FOR THE PRODUCTION THEREOF

FIELD OF THE INVENTION

This invention relates to a novel carbon film comprised of carbon atoms which has similar properties to diamond but does not exhibit an automorphic property of diamond crystal (said carbon film will be hereinafter called "single-bond carbon film") and a process for the production thereof. More particularly, it relates to a novel single-bond carbon film defined by having a peak A at $1340 \pm 20$ cm$^{-1}$ and a peak B at $1580 \pm 10$ cm$^{-1}$ in Raman spectrum; a value of 9.7 or more for the ratio of $I_A/I_B$ between the intensity of said peak A($I_A$) and the intensity of said peak B($I_B$) and a value in the range of from 30 cm$^{-1}$ to 110 cm$^{-1}$ for the half band width of said peak A which is usable as a constituent member in an optical element, a passive electric device or an active electric device, or as a mechanically protective film for the sliding member of a device or an apparatus, and a process for the production thereof.

BACKGROUND OF THE INVENTION

It is well known that there are a great many allotropes for carbon atom because in the case where carbon atoms are bonded, they take any of the bonding states of SP, SP$^2$ and SP$^3$ depending upon the situation.

And as for the crystal comprising carbon atoms, there are known cubic system diamond having SP$^3$ hybrid orbital; cubic system graphite and trigonal system graphite respectively having SP$^2$ hybrid orbital; polyyne and cumurene of an amorphous material having SP hybrid orbital; and cardyne comprising said polyyne being partially crystalized or said cumurene being partially crystalized.

In addition, various amorphous carbons. However, they do not have a common structure are known in that they are of complicated structures containing SP, SP$^2$ or SP$^3$ hybrid orbital, or a mixture of two or more of these orbitals, and dangling bonds being complicatedly intertwined.

Among the above materials, the cubic system diamond has been generally evaluated as being the most preferred to be industrially utilized for the reasons that it has an extremely high transparency to visible light, an excellent insulating property of about $10^{12}$ $\Omega$.cm, a high heat conductivity of corresponding to 5 folds over that of copper at room temperature and a great refractive index of 2.4, and in addition to these advantages, it has an excellent chemical stability and an extreme hardness. In view of this, there have been made various proposals to prepare a diamond film by way of vapor phase reaction method, and said diamond film is expected to be able to be used a wider application area than is the case of a bulk diamond as disclosed in Japanese Patent Laid-Open Nos. 9100/1983 and 110494/1983 and in Japanese Patent Publication No. 2632/1986.

It is known that there may be prepared a diamond-like carbon film such as carbon film or hydrogen-containing carbon film respectively having similar properties to diamond in the case of using ion beam evaporation method or ion beam sputtering method.

Now, in the case where it is tried to prepare a diamond film by way of vapor phase reaction method, the resulting film often becomes not a single crystal film but a polycrystal film which is clearly euhedral due to diamond crystal with its surface and such surface is accompanied with significant irregularities.

And as for this film, it is extremely difficult to make such irregular surface desirably flattened because of its excellent chemical stability and also of its extreme hardness, and because of this, it may be used only in an extremely limited area although it has excellent optical, electric and mechanical properties.

In addition to the above, there is a limit for the kind of a substrate to be used for the deposition of a diamond thereon because the process of forming a diamond is practiced while maintaining the substrate at elevated temperature of 600° C. to 1000° C., and also because of this, the area for the said film is limited.

On the other hand, as for the diamond-like film to be formed by way of ion beam evaporation method or ion beam sputtering method, its surface is even but there are present carbon multiple bonds and not a few hydrogen atoms therein, and because of this, the said diamond-like film is inferior to a diamond with every respect of transparency to visible light, hardness, chemical stability and electrically insulating property and with the point that it is accompanied with a large local strain.

SUMMARY OF THE INVENTION

The present inventors have repeated experimental studies to develop a process which enables one to effectively prepare a desirable carbon film having an even surface and having desirable properties very similar to those of a diamond at a substrate temperature lower than the temperature range of 600° C. to 1000° C. in the abovementioned known process.

As a result, the present inventors finally found a process which enables one to effectively prepare an expected desirable carbon film having an even surface which is clearly distinguished from any of the foregoing known carbon films, which has desirable properties being very close to those of a diamond and which is identified by the characteristics in Raman spectra.

It is therefore an object of this invention to provide a novel carbon film having an even surface which is identified principally by the specific characteristics in Raman spectra, which has very similar properties to a diamond but does not exhibit an automorphic property of diamond crystal and which is usable as a constituent member in an optical element, a passive electric device or an active electric device, or as a mechanically protective film for the sliding member of a device or an apparatus (this film will be hereinafter called "single-bond carbon film" because of the specific, characteristics in Raman spectra).

Another object of this invention is to provide a single-bond carbonic film, matrix of which comprises carbon atoms and which is characterized by having a peak A at $1340 \pm 20$ cm$^{-1}$ and a peak B at $1580 \pm 10$ cm$^1$ in Raman spectrum; a value of 9.7 or more for the ratio of $I_A/I_B$ between the intensity of said peak A($I_A$) and the intensity of said peak B($I_B$) and a value in the range of from 30 cm$^{-1}$ to 110 cm$^{-1}$ for the half band width of said peak A. A further object of this invention is to provide a process for effectively producing said single-bond carbon film.

DETAILED DESCRIPTION OF THE INVENTION

Figure 1:
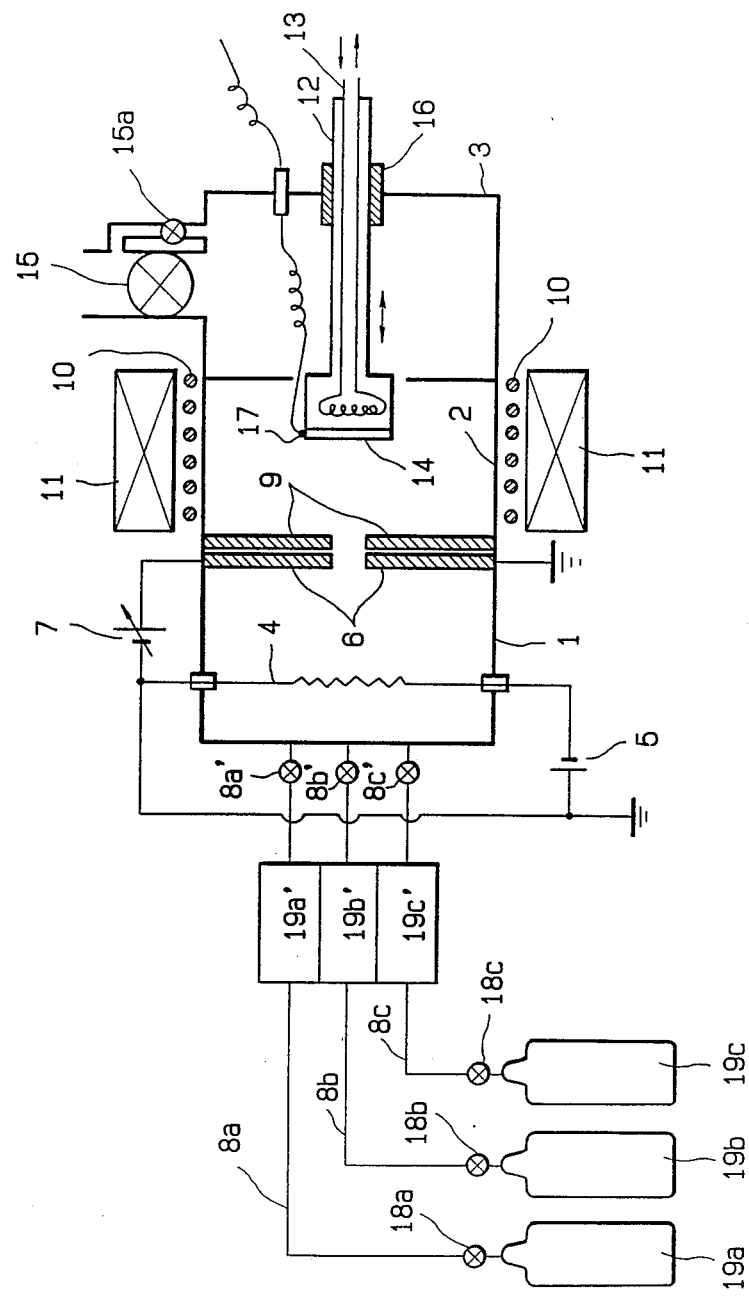
FIG. 1 is a schematic explanatory view of a representative fabrication apparatus for producing the single-bond carbon film according to this invention.

The aforesaid single-bond carbon film according to this invention is amorphous but it does not contain any multiple carbon bonds, which is the point by which the said single-bond carbon film is distinguished from any known amorphous carbon film.

The single-bond carbon film according to this invention can be identified by other factors than those mentioned above. That is, it does not have absorption against visible light having a wavelength of more than 300 nm; it has an optical band gap of 4.0 eV or more; and it has an electrical resistance of $10^{10} \Omega \cdot cm$ at room temperature.

As for the structure of the single-bond carbon film according to this invention, because of amorphous structure, the surface thereof is desirably flat and it is possible to make the irregularities at the surface thereof to be the level of less than RMS 300 Å in a state of asdepo.

As for the situation in Raman spectrum for the single-bond carbon film according to this invention, the characteristic Raman which appears at 1333 $cm^{-1}$ in the case of a known diamond is moved within the range of $1340 \pm 20$ $cm^{-1}$ because of its amorphous structure to widen the half band width.

Now, the single-bond carbon film according to this invention is clearly distinguished from any of the known diamond-like films. That is, the known diamond-like films can be categorized into two kinds; one of which contains hydrogen atoms and the other one comprises only carbon atoms. The former diamond-like film is clearly distinguished from the single-bond carbon film according to this invention with the point that it contains not a few hydrogen atoms. As for the latter diamond-like carbon film, it is transparent only against infrared ray but not against visible light namely ultraviolet ray because it contains multiple carbon bonds [See, S. Aisenberg and R. Chabot, J. Appl. Phys., 42, 2953 (1971)]. In the case of other diamond-like film containing a small diamond crystal structure of about 20 nm in its film structure, it is in a pale-yellow colored state because of containing multiple carbon bonds in its amorphous portion [See, E. G. Spencer et al., Appl. Phys. Lett., 29, 118 (1976)].

The above-mentioned points by which the single-bond carbon film according to this invention is distinguished from both the known diamond and the known diamond-like film will be summarized in the following.

(1) Any analytic peak is not observed either in X-ray diffraction analysis or in electron diffraction analysis. This is the point by which the single-bond carbon film is distinguished from the known diamond crystal.

(2) Any absorption of ray of more than 300 nm in wavelength is not observed in visible ultraviolet absorption spectra, and the optical band gap is 4.0 eV or more. This is the point by which the single-bond carbon film according to this invention is distinguished from the known diamond-like film.

(3) In Raman spectrum, there is observed a broad band having a peak near 1340 $cm^{-1}$ but not any peak near 1600 $cm^{-1}$. This is the point by which the single-bond carbon film is distinguished from the known diamond crystal and also from the known diamond-like film.

Figure 2:
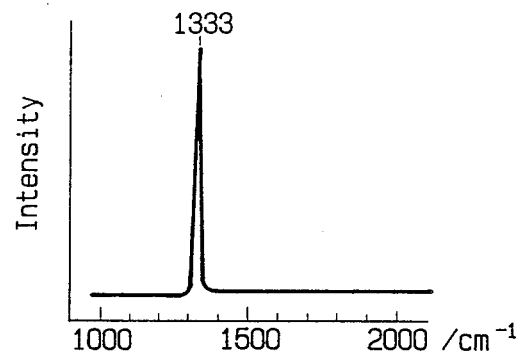
FIG. 2 shows a graph illustrating a typical example of Raman spectrum for a known diamond.
Figure 3:
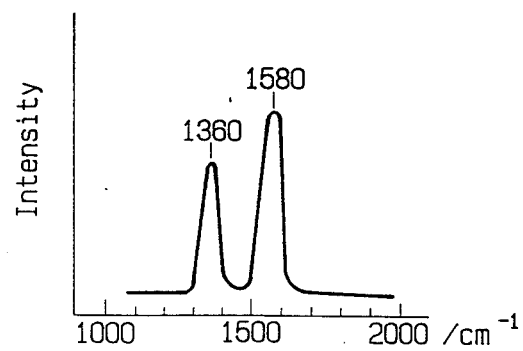
FIG. 3 shows a graph illustrating a typical example of Raman spectrum for a known diamond-like film.

Now, there are shown a Raman spectrum of the known diamond crystal in FIG. 2 and a Raman spectrum of the known diamond-like film in FIG. 3.

Figure 4:
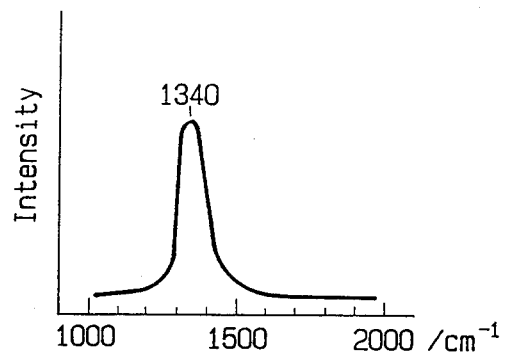
FIG. 4, FIG. 5, FIG. 6 and FIG. 7 respectively shows a graph illustrating a typical example of Raman spectrum for a single-bond carbon film to be provided according to this invention.
Figure 5:
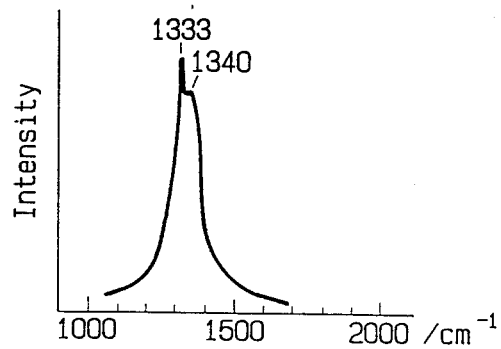
Figure 6:
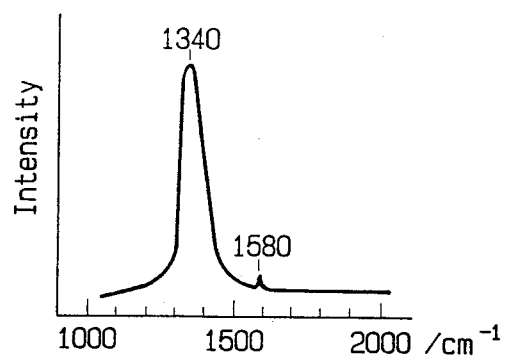
Figure 7:
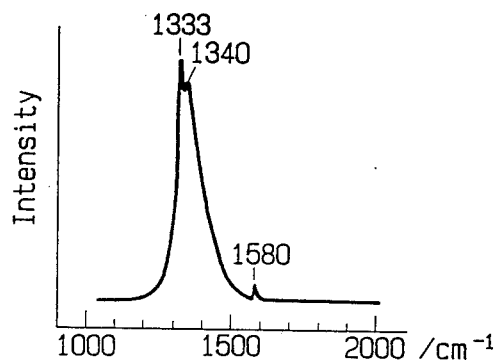

Further, there are shown a Raman spectrum of a single-bond carbon film to be provided according to this invention which is comprised of single-bond carbon only in FIG. 4; a Raman spectrum of another single-bond carbon film to be provided according to this invention which contains, in addition to single-bond carbon, diamond crystal structure in the allowable limited range in FIG. 5; a Raman spectrum of a further single-bond carbon film to be provided according to this invention which contains, in addition to single-bond carbon, graphite structure in the allowable limited range in FIG. 6; and a Raman spectrum of a still further single-bond carbon film to be provided according to this invention which contains, in addition to single-bond carbon, diamond crystal structure and graphite structure respectively in the allowable limited range in FIG. 7.

Among the above-mentioned four kinds of single-bond carbon films, the single-bond carbon film giving such Raman spectrum as shown in FIG. 4 is the most preferred.

Additionally explaining, there is recognized a sharp specific peak at 1333 $cm^{-1}$ in the spectrum for the diamond crystal, and there is recognized a broad specific peak near 1600 $cm^{-1}$ which is thought to be caused by a double bond of carbon atoms in the spectrum for the diamond-like carbon film.

On the other hand, in the case of the most representative single-bond carbon film according to this invention, there is recognized only a broad specific peak near 1340 $cm^{-1}$ in the spectrum therefor.

The present inventors have experimentally found a fact that a single-bond carbon film should be such that it has a peak near 1600 $cm^{-1}$ which is thought to be caused by a double bond of carbon atoms and another certain peak near 1333 $cm^{-1}$ which is thought to be caused by the diamond structure in the spectrum therefor, as long as satisfying the conditions: (1) that there is a peak A at $1340 \pm 20$ $cm^{-1}$ and a peak B at $1580 \pm 10$ $cm^{-1}$ in Raman spectrum; (2) that there is a value of 9.7 or more for the ratio of $I_A/I_B$ between the intensity of said peak $A(I_A)$ and the intensity of said peak $B(I_b)$ and (3) that there is a value in the range of from 30 $cm^{-1}$ to 110 $cm^{-1}$ for the half band width of said peak A, the said single-bond carbon film having satisfactory transparency to visible light and a satisfactory surface flatness of less than 300 Å by RMS.

In view of this, such single-bond carbon film as above mentioned is also included in the present invention.

Now, the single-bond carbon film according to this invention has a satisfactory surface flatness of less than 300 Å by RMS, has a density of 2.4 or more, and is chemically very stable as in the case of a diamond.

As for the bond distance between C and C and the bond angle in the single-bond carbon film according to this invention, they are not constant as in the case of a diamond but they are broadening around their values of the diamond. In this respect, in the case of the single-bond carbon film according to this invention, peak A based on the C-C stretching vibration in the Raman spectrum therefor will appear between 1320 and 1360 cm$^{-1}$ depending upon the film forming condition and its half band width will become 30 cm$^{-1}$ or more. In the case of a carbon film showing a half band width of more than 110 cm$^{-1}$, a large amount of graphite components will be contained in the resulting film that results in making colored in from brown to black. And the resultant film in this case is reactive with a strong acid such as hydrofluoric acid or oxalic acid, and because of this, it is defective in the chemical stability.

In view of this, the single-bond carbon film according to this invention is desired to be such that it has a half band width in the range of from 30 to 110 cm$^{-1}$ for the peak A in its Raman spectrum.

The single-bond carbon film as above explained which is provided according to this invention contains a structural distortion which is thought to be caused by distatisfaction of the stable conditions for the C-C single bond i.e. bond angle: 109°28' for SP$^3$ bond and bond distance: 1.53 Å. In view of this, there will be such an occasion for the said single-bond carbon film to be unstable under environmental temperature condition of more than 500° C.

However, this problem may be effectively eliminated by incorporating a trace amount of one or more elements (hereinafter referred to as "trace amount element") other than carbon atom thereinto.

In the case where such trace amount element is incorporated into the single-bond carbon film according to this invention, the resulting single-bond carbon film becomes such that it provides, in addition to, the above advantage, a further advantage that makes it possible to have wider values of physical properties than in the case of the foregoing single-bond carbon film not containing any such trace amount element.

As the trace amount element to be incorporated in the single-bond carbon film according to this invention, such element which cannot be incorporated into a diamond crystal lattice because of its largeness can be also used since the said single-bond carbon film is amorphous.

Specific examples of said trace amount element are, for example, Si, Ge, N, P, As, B, Al, O, S, Se, Te, F, Cl, Br, I, He, Ne, Ar, Kr, Xe, Rn, H, Sc and Y, and other than these, a lanthanoid element selected from the group consisting of lanthanoids La through Lu excluding Pm, an element selected from the group consisting of alkali metals excluding Li and alkaline earth metals, Fe, Mn and Ni.

Any of these trace amount elements contributes to stabilizing the film structure of the single-bond carbon film according to this invention because of a factor of its atomic radius, difference of its bond angle, difference of its valence, its covalent binding property or its ion binding property alone or because of these factors in combination.

As for the single-bond carbon film containing any of the above trace amount element, its hardness, refractive index, chemical stability and surface flatness are more or less around the same as the single-bond carbon film not containing any trace amount element. However, its Raman spectrum or physical properties such as optical band gap, heat conductivity, electric resistance or activation energy of the electric resistance are occasionally different from those of the single-bond carbon film.

Firstly, as for the Raman spectrum, there will be a case when there appears a peak caused by the bonds between carbon atom and a trace amount element and between trace amount elements near 1600 cm$^{-1}$ in addition to the peak A at 1340±20 cm$^{-1}$.

In view of the above, the amount of the foregoing trace amount element to be contained in the single-bond carbon film is so controlled that the intensity of said peak becomes to be 1/50 or less over the intensity ($I_A$) of the peak A.

Further, depending upon the amount of the foregoing trace amount element to be contained in the single-bond carbon film, the resulting film will be occasionally colored and the optical band gap will become small accordingly. And there is a phenomenon that the heat conductivity will be changed depending upon the amount of the foregoing trace amount element. Particularly, as for the electric resistance, it will be significantly changed to give a value between $10^{10}$ and $10^{-2}$ Ω.cm at room temperature depending upon the amount and the kind of the foregoing trace amount element, wherein the activation energy of the electric conductivity will be a value of 0.05 to 0.5 eV.

In view of the above, in the case where it is intended to prepare a trace amount element-containing single-bond carbon film according to this invention, it is desired to selectively use a proper trace amount element from among the above-mentioned trace amount elements and properly determine its amount to be incorporated into the film depending upon its purpose.

According to this invention, there are provided two kinds of single-bond carbon films, namely, a single-bond carbon film comprising carbon atoms (Film I) and a single-bond carbon film containing carbon atoms and a trace amount element (Film II), respectively having physical properties as shown in Table 1.

Explanation will be made about production of any of the foregoing single-bond carbon films according to this invention.

This invention also provides a process for producing any of the foregoing single-bond carbon films, and it has been accomplished having due regard to the following findings which have been confirmed by the present inventors through extensive studies on the known process for producing a carbon film. That is, (1) when the substrate is maintained at elevated temperature such as 600° C. or more, there is a tendency for active species containing atoms to be constituents of the resulting film colling against the surface of the substrate and then migrating to a portion where the energy level is the lowest on the surface of the substrate, whereby the resulting film is made crystalline; (2) when the resulting film is intended to be amorphous in the case (1), it is necessary for the substrate to be maintained at a low temperature; (3) there is a tendency that when the substrate is maintained at an excessively low temperature and the active species contains hydrogen atoms in the case (2), removal of hydrogen atoms from the resulting film during film-forming process hardly occurs and as a result, the resulting film will become such amorphous carbon film which contains a large amount of hydrogen atoms; and (4) in the case of the known process for producing a carbon film wherein there is applied a kinetic energy having a strong rectilinearly advancing property to an active species containing carbon atoms only as the constituent by accelerating it with a voltage or by sputtering a relevant target, there is a strong tendency that there will be formed such carbon film which contains a large amount of carbon multiple bonds.

Now, in the process for producing an objective single-bond carbon film, there is used an active species source capable of contributing to formation of said film which is formed by exciting C+ ion or He+ ion in plasma, which are generated by subjecting a relevant raw material gas to the action of microwave energy, direct current energy or heat energy, by way of ion cyclotron resonance.

The above He+ ion contributes to making a chemical species, which is capable of supplying carbon atoms to be the constituents of the film to be formed, to be in a state capable of causing the formation of said objective single-bond carbon film on a substrate by supplying its energy onto said chemical species.

In the process according to this invention, the above ions absorb electromagnetic waves resonating with the magnetic field as applied to thereby store a rotating kinetic energy therein while enlarging their rotation radiuses and the ions having said energy then collide against the surface of a substrate on which a film is to be formed and excite other chemical species capable of contributing to formation of the objective single-bond carbon film to thereby cause the formation of an objective single-bond carbon film on the substrate.

In order to practice the above process according to this invention, an appropriate fabrication apparatus is used.

In FIG. 1, there is shown a representative example of such apparatus.

The apparatus shown in FIG. 1 comprises an ionization chamber 1 made of stainless steel and a deposition chamber comprising an ion cyclotron resonance chamber 2 (front chamber) made of a quartz and a rear chamber 3 made of stainless steel. With the ionization chamber 1, there are provided raw material gas feed pipes 8a, 8b and 8c which are respectively extended through respective mass flow controllers 19a', 19b' and 19c' from respective reservoirs 19a, 19b and 19c and open thereinto. The feed pipes 8a, 8b and 8c are respectively provided with reservoir valves 18a, 18b and 18c and regulating valves 8a', 8b' and 8c'. Numeral 4 stands for a tungsten-filament installed in the ionization chamber 4 so as to generate heat energy sufficient enough to ionize a raw material gas as entered therein. The tungsten-filament is electrically connected to a power source 5. Numeral 6 stands for an ion extracting electrode made of a molybdenum installed between the ionization chamber 1 and the ion cyclotron resonance chamber 2 (front chamber) which functions to extract ions from the ionization chamber 1 into the front chamber 2. Numeral 9 stands for a floating electrode installed in the rear side situated in the front chamber 2 which functions to stabilize ion beam from the ionization chamber. The electrode 6 and the floating electrode 9 are electrically connected to a variable power source (D.C. power source) 7 to supply a desired electric potential to them. With the front chamber 2 (ion cyclotron resonance chamber), there are provided a high frequency power supplying coil 10 and an electro-magnet 11 through its circumferential wall. The coil 10 is electrically connected to a high frequency power generating circuit and a system of stabilizing the high frequency power to be generated (this part is not shown in FIG. 1).

For the magnet 11, there is provided a current control circuit (not shown in FIG. 1) so that the current of the magnet 11 may be properly controlled within a fluctuation of ±1A.

Further, the magnet 11 is mounted in the way that it may optionally move on rails in parallel to the circumferential wall of the deposition chamber in the case where necessary to change the distribution of magnetic field (this part is not shown in FIG. 1).

Now, the frequency $v$ of a high frequency electric power for the ion of a mass M to cause ion cyclotron resonance at the time when the magnetic flux density is B is enough as long as it satisfies the relation represented by the equation: $v = q \cdot B / 2\pi M$, wherein q is the quantity of electricity of the ion. For instance in this respect, when there is used a high frequency of 13.6 MHz, the ion cyclotron resonance magnetic fields of H+, He+ and C+ are 0.9, 3.6 and 11 tesla, respectively.

In the case where the above relation is satisfied, the resonated ion absorbs a high frequency electric energy to store the energy as the rotation kinetic energy within the ion, whereby it becomes capable of contributing to formation of an objective single-bond carbon film according to this invention.

An objective single-bond carbon film according to this invention may be properly formed on an appropriate substrate using the ion selectively excited in this way.

Numeral 12 stands for a substrate holder for a substrate 14 on which a film is to be formed. The substrate holder 12 contains a water-cooled tube 13 installed therein to adjust the temperature of the substrate to a desired value. Numeral 16 stands for a mechanical driving system to move the substrate holder 12 to adjust the position of the substrate 14. Numeral 17 stands for a thermo couple which is electrically connected to a substrate temperature controlling circuit (not shown), which is also electrically connected to a cooling-water supplying system (not shown) by which a cooling water is flowed through the water-cooled tube 13 in the case where necessity happens as a result of the measurement of the substrate temperature through the thermo couple 17.

With the rear chamber 3, there is provided with an exhaust pipe which is connected through a main valve 15 to an exhaust system comprising rotary pump, mechanical booster pump or turbo-molecular pump (not shown). Numeral 15a stands for a subsidiary valve.

In the following, explanation will be made about the case of forming an objective single-bond carbon film according to this invention using C+ ion formed by applying a high frequency power of 13.6 MHz and a magnetic field of 11 tesla.

Firstly, the reservoir valves 18a, 18b and 18c are all closed and the regulating valves 8a', 8b' and 8c' and the mass flow controllers 19a', 19b' and 19c' are completely opened. Then, the main valve 15 and the subsidiary valve 15a are opened, and the ionization chamber 1, the front chamber 2 and the rear chamber 3 are concurrently evacuated to bring their insides to a vacuum of about $5 \times 10^{-5}$ Torr by operating the foregoing exhaust system such as rotary pump, mechanical booster pump or turbo-molecular pump.

Successively, opening the reservoir valves 18a and 18b, CH$_4$ gas from the reservoir 19a and He gas from the reservoir 19b are introduced into the ionization chamber 1 while controlling their flow rates respectively to 10 SCCM and 5 SCCM by regulating the regulating valves 8a' and 8b' and the corresponding mass flow controllers 19a' and 19b'. Thereafter, closing the main valve 15, the insides of the said three chambers are adjusted to a vacuum of about $5 \times 10^{-4}$ Torr by regulating the subsidiary valve 15a. Then, the power source 5 is switched on to supply a voltage, for example, of 30 V onto the tungusten-filament 4, whereby CH$_4$ gas and He gas are excited with the action of the heat energy generated by the filament 4 to generate the corresponding ions containing $C^+$ ions. The thus generated $C^+$ ions are successively extracted in a beam state into the front chamber 2 (ion cyclotron resonance chamber) by the ion extracting electrode 6 onto which a voltage of 5 KV is supplied by switching on the variable power source 7, wherein the $C^+$ ions to be extracted in a beam state is being stabilized by the floating electrode 9. In this case, the current density at the position of being 3 cm distant from the surface of the ion extracting electrode 6 in the side of the front chamber 2 is $1 A/cm^2$.

Then, the high frequency electric power source is switched on to apply 300 W of a high frequency electric power (13.6 MHz) through the high frequency electric power supplying coil 10 onto the thus extracted beam in the front chamber 2, where a magnetic field of 11 tesla is applied through the electro-magnet 11.

As the substrate 14, there is used a wafer comprising a single crystal Si(111). This substrate is firmly attached onto the substrate holder 12 and its position in the front chamber 2 is adjusted at the position of being 15 cm distant from the surface of the ion extracting electrode 6 in the side of the front chamber 2 by moving the substrate holder 12. And the largeness of the magnetic field is adjusted to be 10 tesla at the surface of the substrate 14 and to be 11 tesla at the forward position of being 2 cm distant from the surface of the substrate 14.

The substrate temperature during film-forming process is controlled to be $260 \pm 30°$ C. by flowing cooling-water into the water-cooled tube 13, wherein the substrate temperature is measured by the thermo couple 17.

Following the above-mentioned procedures and carrying out the film-forming process for 3 hours, there were prepared a plurality of single-bond carbon film samples. As a result of examining the physical properties for a randomly chosen one among the resultant samples, there were obtained the following results.

That is, in the electron diffraction, there was not observed any analytic peak. In the Raman spectrum, there was observed only a Raman peak having a peak at 1335 $cm^{-1}$ of which half band width being 90 $cm^{-1}$.

It was then found that this film sample has a Vickers hardness of 8000 $kg/mm^2$, a refractive index of 2.3, a surface flatness of 250 Å/RMS and an optical band gap of 4.2 eV.

Then, there were made studies of whether possible to produce an objective single-bond carbon film in the case where ion cyclotron resonance is caused with an ion species other than causing ion cyclotron resonance with $C^+$ ion.

That is, as the ion species with which ion cyclotron resonance is caused, there were selected $H^+$ ion and $He^+$ ion, and the magnetic fields to be applied against said two ion species were made to be 0.9 tesla and 3.6 tesla, respectively. Other film-forming conditions than the above were made as shown in Table 2.

In this way, there were prepared two film samples A-1 and A-2.

For each of the two cases, there were made observations on the film-forming process and also on the resultant. The results were as shown in Table 2.

As Table 2 illustrates, it is understood that there is not formed any film except that the substrate is etched in the case of using $H^+$ ion. It is also understood that there is formed an objective single-bond carbon film of this invention in the case of using $He^+$ ion. In this respect, it is understood that the ion species than $C^+$ ion which is capable of causing desired ion cyclotron resonance is $He^+$ ion.

As for the raw material gas which is introduced into the ionization chamber 1 to generate $C^+$ ion, any known carbon-containing gas can be optionally used as long as it causes the formation of an objective single-bond carbon film according to this invention.

However, there is an occasion that as the said raw material gas, a selected one should be used depending upon the kind of ionization method to be employed. For example, in the case where the ionization process is carried out in accordance with a known Kaufmann type method using a tungusten-filament as the ionization means as above mentioned, said tungusten-filament will be sometimes corroded with certain carbon-containing substance. In this case, it is desired to selectively use such raw material gas which does not make the tungusten-filament corroded.

Specific examples of the carbon-containing raw material gas to be used for the generation of $C^+$ ion are, for example, saturated hydrocarbons such as methane, ethane, propane, butane and pentane; supersaturated hydrocarbons such as benzene and naphthalene; and derivatives of these compound, part of which hydrogen atoms are substituted with relevant substituents such as —OH, —C=O, —CHO, —C≡N and —NH$_2$.

Even in the case of using $He^+$ ion as the ion species to cause desired ion cyclotron resonance, it is a matter of course that there is used a proper carbon-containing raw material gas capable of supplying carbon atoms to be the constituents of an objective single-bond carbon film according to this invention. As such carbon-containing raw material gas, any of the foregoing carbon-containing gases may be optionally used. And it is possible to concurrently use two or more kinds of said gases.

In a preferred embodiment, the carbon-containing raw material gas capable of supplying carbon atoms is introduced into the ionization chamber 1 as above mentioned. However, in an alternative, it is possible to introduce said raw material gas into the ion cyclotron resonance chamber 2. In other alternative in this respect, it is possible to introduce said raw material gas into both the ionization chamber 1 and the ion cyclotron resonance chamber 2. In any of said cases, the position through which said raw material gas is introduced should be properly decided with due regards on the interrelations of the film-forming conditions and the apparatus to be used.

As the ionization method to be carried out in the ionization chamber 1, there can be employed, other than the above-mentioned Kaufmann type method using a filament, any known other method using microwave discharge, direct current discharge or RF discharge.

These ionization methods may be selectively employed depending upon the kind of the apparatus to be used, the kind of the raw material gas to be used, the characteristics desired for the resulting single-bond carbon film, etc.

As for the voltage to be applied onto the ion extracting electrode 6, it is desired to be in the range of 500 V to 10 KV where the high electric potential end of the filament 4 is made to be a cathode. In the case where the voltage to be applied onto the ion extracting electrode 6 is controlled to a voltage value in the said range, it is desired for the entire ion beam current to be controlled to be a value of 20 $mA/cm^2$ to 2 $A/cm^2$ at the position of being 3 cm distant in the ion downstream direction from the surface of the ion extracting electrode 6 in the ion cyclotron resonance chamber 2.

The said values for the entire ion beam current is not absolute, but it is properly determined based on the organic interrelations among the kind of the ion species to be generated in the ionization chamber, the condition for causing ion cyclotron resonance, the position for causing ion cyclotron resonance, the position for the substrate to be placed, inner pressure and the like.

As for the inner pressure of the ion cyclotron resonance chamber 2 under which desired ion cyclotron resonance is caused, it is properly determined such that desired ion cyclotron resonance may be sufficiently caused. Specifically, it is preferably $1 \times 10^{-3}$ to $1 \times 10^{-5}$ Torr.

As for the application of a high frequency electric power, it is carried out through the coil 10 provided with the circumferential wall of the ion cyclotron resonance chamber 2 in the case of the apparatus shown in FIG. 1. However, in an alternative, it is possible to be carried out by way of plane parallel plate electrode being placed in the ion cyclotron resonance chamber 2. However, in this case, there will be the possibility that the constituents of the plate electrode will be removed therefrom to contaminate into the resulting film during film-forming process.

Therefore, in the case of producing a single-bond carbon film not containing any trace amount element of this invention, it is desired to apply a high frequency electric power through the coil 10 in the way of the apparatus shown in FIG. 1.

As for the input of the high frequency electric power to be applied, it is preferably in the range of from 50 W to 600 W from the viewpoint of producing a desirable single-bond carbon film free of any damage.

As for the position where there is given a magnetic field of an intensity strong enough to cause ion cyclotron resonance in the ion cyclotron resonance chamber 2, the position near the surface of the substrate 14 on which a film is to be formed or the position being quite distant from the said surface may be properly selected depending upon the organic interrelations among the related conditions.

As for the substrate temperature, it is preferably in the range of from room temperature (about 25° C.) to 400° C., and more preferably in the range of from 100° to 300° C., from the viewpoints of preventing the formation of a crystal and forming a desired objective single-bond carbon film of a good amorphous quality.

As for the position where a substrate is placed (hereinafter referred to as "substrate placing position"), it is one of the important parameters to govern the film quality of the resulting film. Therefore, the substrate placing position is properly decided with due regards on the apparatus to be used, the film-forming conditions, the ion conditions, the kind of the ion species to cause ion cyclotron resonance, etc.

In the case of the apparatus shown in FIG. 1 for example, it is desired for the substrate placing position to be situated at the position of being 5 cm or more distant from the surface of the ion extracting electrode 6 in the ion downstream side in the ion cyclotron resonance chamber 2 in the case when a substrate is placed in the said chamber 2. In this case, when the substrate placing position is situated at the position of being less than 5 cm distant from the surface of the extracting electrode 6 in the ion cyclotron resonance chamber 2, it becomes difficult to establish a desired ion cyclotron resonating condition.

Further, in the case where a substrate 14 is placed in the rear chamber 3, the substrate placing position is desired to be situated at the position being 7 cm or less distant from the boundary wall between the front chamber 2 (ion cyclotron resonance chamber) and the rear chamber 3. In the case where the said distance from the boundary wall is beyond 7 cm, there will often occur the case where no film is formed.

DESCRIPTION OF THE PREFERRED EMBODIMENTS

The invention will be described more specifically while referring to the following Examples, but the invention is no way limited only to these Examples.

EXAMPLE 1

Using the apparatus shown in FIG. 1 and in accordance with the foregoing film-forming procedures, there were prepared six carbon film samples (Sample Nos. 1-1, 1-2, 1-3, 1-4, 1-5 and 1-6). As the substrate 14, there was used a single crystal Ge (111) wafer in each case.

The film-forming condition were made as follows:
Maximum magnetic field: 11 tesla
Inner pressure of the ionization chamber 1: $5 \times 10^{-5}$ Torr
Substrate placing position in the front chamber 2: at the position of being 8 cm distant from the extracting electrode 6 in the ion cyclotron resonance chamber 2. And the intensity of the magnetic field at the surface of the substrate was made to be 11 tesla/C+ ion cyclotron resonating magnetic field.
Gases used: $CH_4$, He and $H_2$
These three kinds of gases were introduced in to the ionization chamber 1 with the flow amount ratio of 2:1:1.
Other film-forming conditions (substrate temperature and RF power) than the above were made to those mentioned in Table 3 for each case.

For ionizing said raw material gases, the foregoing procedures were repeated.

Each of the resultant six film samples was evaluated in accordance with the foregoing procedures. The evaluation results obtained were as shown in Table 3.

As Table 3 illustrates, it is understood that Sample No. 1-6 film, which was prepared with a RF power of being beyond 600 W, is not acceptable because of containing undesired diamond structure and because of undesired surface flatness.

Then, it was found that Sample Nos. 1-1 to 1-5 films are desired single-bond carbon films respectively having a desirably flat surface of this invention, and they are suited for use in coating the surface of a glass.

EXAMPLE 2

Using the apparatus shown in FIG. 1 and in accordance with the foregoing film-forming procedures, there was prepared a single-bond carbon film containing Ge as the trace amount element on a single crystal Si(111) wafer as the substrate.

As the raw material gas, there were used $CH_4$, $H_2$ and $GeH_4$, and there were introduced into the ionization chamber 1 with the flow amount ratio of 100:1:50.

Other film-forming conditions were made as follows:

Inner pressure of the ionization Chamber 1: $6 \times 10^{-5}$ Torr
Voltage applied onto the filament 4: 40 V
Voltage applied onto the ion extracting electrode 6: 2.5 KV
Intensity of the magnetic field at the surface of the substrate: 11 tesla/C+ ion cyclotron resonating magnetic field
Substrate placing position at the position in the rear chamber 3 of being 5 cm distant from the boundary wall between the front chamber 2 and the rear chamber 3
RF power applied: 500 W
Substrate temperature: 150° C.
Film formation period: 3 hours The deposition rate was 2.7 μm/hour.

The resultant film was subjected to X-ray diffraction and also to electron diffraction. As a result, there was not observed any peak in any case.

In the Raman spectrum, there appeared a broad band having a peak at 1330 cm$^{-1}$ but no peak appeared near 1600 cm$^{-1}$.

As a result of examining the surface flatness of the resultant film, it was found that its surface flatness is less than 250 Å/RMS. And as a result of examining its electric resistance, it was found that the resultant film has an electric resistance of 105 Ω.cm.

Further, the resultant film was subjected to 100 times heating cycle of room temperature to 400° C. 100 times. However, its physical properties were not changed.

From the above results, it was found that the resultant film is a desired single-bond carbon film which has a desired surface flatness and has a wealth of many practically applicable physical properties.

It was also found that the resultant single-bond carbon film is suitable for use as an abrasion-protective film.

EXAMPLE 3

The procedures of Example 2 were repeated, except that a plurality of raw material gases were used with the flow amount ratio as shown in Table 4, the inner pressure was changed as shown in Table 4 and the substrate temperature was made to be 250° C., to thereby prepare a plurality of carbon film samples (Sample Nos. 3-1 to 3-5). Each of the resultant carbon film samples (Sample Nos. 3-1 to 3-5) was evaluated.

The evaluation results obtained were as shown in Table 4.

EXAMPLE 4

Using the apparatus shown in FIG. 1 and in accordance with the foregoing film-forming procedures, there was prepared a single-bond carbon film on a single crystal Si (111) wafer as the substrate.

As the floating electrode 9, there was used a member having a 5000 Å thick coat comprised of Y formed by a known electron beam thermal deposition method. As the raw material gas, there were used CH$_4$ and He, and they were introduced into the ionization chamber 1 with the flow amount ratio of 1:1.

Other film-forming condition were made as follows:
Inner pressure of the ionization chamber 1: $2 \times 10^{-4}$ Torr
Voltage applied onto the filament 4: 45 V
Voltage applied onto the ion extracting electrode 6: 2 KV
Intensity of the magnetic field at the surface of the substrate: 4 tesla/He+ ion cyclotron resonating magnetic field against RF power (13.56)
Substrate placing position at the position of being 10 cm distant from the ion extracting electrode 6 in the ion cyclotron resonance chamber 2
RF power applied: 450 W
Substrate temperature: 150° C.
Film-forming period: 2.5 hours As a result of examining the resultant single-bond carbon film, it was found that said film contains Y in a trace amount. And it showed a peak at 1340 cm$^{-1}$ of which half bond width being 48 cm$^{-1}$ in the Raman spectrum, and it had a surface flatness of 235 Å/RMS.

As a result of subjecting said film to 200 times heating-cycles of room temperature to 500° C. under 90% humidity environmental condition, there was not observed any change on its physical properties.

Further, in light excitation, there was observed light emission caused by d-d transition of Y, and because of this, it was found that said carbon film is usable as a photoresponsive element.

EXAMPLE 5

The procedures of Example 4 were repeated, except that a Mg-ribon was used as the floating electrode 9, to thereby prepare a single-bond carbon film.

As a result of examining the resultant carbon film, said film showed a broad band having a peak at 1340 cm$^{-1}$ in the Raman spectrum, and it had a surface flatness of 250 Å/RMS.

And as a result of subjecting said film to 200 times heating-cycles of room temperature to 500° C. under 90% humidity environmental condition, there was not observed any change on its physical properties.

And in light excitation, there was observed light emission, and because of this, it was found that said carbon film is usable as a photoresponsive element.

EXAMPLE 6

Using the apparatus shown in FIG. 1 and in accordance with the foregoing film-forming procedures, there was formed a 7 μm thick single-bond carbon film on a single crystal Si(111) wafer. As the raw material gas, there were used CH$_4$, He, H$_2$ and O$_2$. Said He gas was introduced into the ionization chamber 1 at a flow rate of 10 SCCM, and at the same time, said CH$_4$, H$_2$ and O$_2$ gases were introduced through the feed pipe provided near the floating electrode (this part is not shown) into the ion cyclotron resonance chamber 2 at respective flow rates of 10, 10 and 0.5 SCCM.

Other film-forming condition were made as follows:
Inner pressure of the ionization chamber 1: $5 \times 10^{-4}$ Torr
Voltage applied onto the filament 4: 45 V
Voltage applied onto the ion extracting electrode 6: 2.5 KV
Intensity of the magnetic field at the position of being 5 cm distance from the ion extracting electrode 6 in the front chamber 2: 3.6 tesla/He+ ion cyclotron resonating magnetic field against a magnetic wave of 13.6 MHZ
Substrate placing position at the position in the rear chamber 3 of being 5 cm distant from the boundary wall between the front chamber 2 and the rear chamber 3
RF power applied: 450 W
Substrate temperature: 300±3° C.

Film-forming period 3 hours

The resultant carbon film showed a Raman peak at 1330 cm$^{-1}$, having a half band width of 50 cm$^{-1}$ in the Raman spectrum.

As a result of examining said carbon film, it was found that its surface flatness is 150 Å/RMS, its Vickers hardness is 6500 kg/mm$^2$, and its optical band gap is 4.3 eV.

In view of the above, it was recognized that said carbon film is usable as a coating member for an optical element.

TABLE 1

| kind of the film physical properties | Film I | Film II |
|---|---|---|
| x-ray diffraction | — | — |
| Raman spectrum (cm$^{-1}$) | 1340 ± 20 | 1340 ± 20 |
| Optical band gap(eV) | ≧4.0 | ≧2.1 |
| Hardness(kg/mm$^2$) | ≧7500 | ≧7500 |
| Surface Flatness [RMS (Å)] | ≦300 | ≦300 |
| Refractive index | 2.2 | 2.0~2.2 |
| Heat conductivity(W/K) | 10 | 8 |
| Density | ≧2.4 | ≧2.4 |
| Electric conductivity ($\Omega \cdot$ cm) | ≦10$^{10}$ | 10$^{-2}$~10$^{10}$ |
| Resistances to acids and alkalis | Good | Good |

TABLE 2

| Sample No. | A-1 | A-2 |
|---|---|---|
| Magnetic field applied(tesra) | 0.9 | 3.6 |
| Substrate temperature (°C.) | 270 | 270 |
| Gases used | CH$_4$ H$_2$ | CH$_4$ He |
| Flow rate(sccm) | CH$_4$:10 H$_2$:5 | CH$_4$:10 He:5 |
| Inner pressure (Torr) | 3 × 10$^{-4}$ | 3 × 10$^{-4}$ |
| High frequency power (Rf power) (13.56 MHz) | 300 | 300 |
| Substrate | Single crystal Si (111) wafer | Single crystal Si (111) wafer |
| Deposition rate ($\mu$/h) | Etching occured & no film formed | 3.0 |
| X-ray diffraction | — | No crystalinity recognized |
| Electron diffraction | | |
| Raman spectrum | — | A peak of 30 cm$^{-1}$ half band width appeared at 1345 cm$^{-1}$ |
| Vickers hardness (Kg/mm$^2$) | — | 8000 |
| Refractive index | — | 2.2 |
| Surface flatness [RMS (Å)] | — | 280 |
| Electric resistance ($\Omega \cdot$ cm) | — | 10$^{11}$ |
| Optical band gap (eV) | — | 4.3 |

TABLE 3

| Sample No. | 1-1 | 1-2 | 1-3 | 1-4 | 1-5 | 1-6 |
|---|---|---|---|---|---|---|
| RF power | 50 | 100 | 300 | 450 | 600 | 800 |
| Substrate temperature (°C.) | 232 | 243 | 265 | 320 | 350 | 680 |
| [Evaluations] | | | | | | |
| X-ray & electron diffractions | — | — | — | presence of diamond structure | presence of diamond structure | presence of diamond structure |
| Raman peak position (cm$^{-1}$) | 1350 | 1345 | 1350 | 1330 | 1333 1340 | 1333 |
| I$_{1340}$/I$_{1580}$ | 10.2 | 15 | 19 | 25 | ∞ | ∞ |
| Surface flatness [RMS (Å)] | 250 | 230 | 280 | 275 | 275 | 4500 |
| Optical band gap (eV) | 3.99 | 4.0 | 4.2 | 4.3 | 4.4 | 4.8 |
| Electric resistance ($\Omega \cdot$ cm) | ≧10$^{11}$ | ≧10$^{11}$ | ≧10$^{11}$ | ≧10$^{11}$ | ≧10$^{11}$ | ≧10$^{11}$ |
| Refractive index | 2.1 | 2.1 | 2.2 | 2.2 | 2.2 | 2.3 |

TABLE 4

| Sample No. | 3-1 | 3-2 | 3-3 | 3-4 | 3-5 |
|---|---|---|---|---|---|
| Gases used | CH$_4$,H$_2$,NH$_3$ | CH$_4$,O$_2$ | CF$_4$,F$_2$ | CH$_4$,H$_2$,Fe (CO)$_6$ | CH$_4$,H$_2$, He |
| Flow amount ratios | 1:2:0.1 | 1:1 | 1:1 | 1:1:0.1 | 1:1:1 |
| Inner pressure (Torr) | 2 × 10$^{-4}$ | 3 × 10$^{-4}$ | 3 × 10$^{-4}$ | 5 × 10$^{-4}$ | 4 × 10$^{-4}$ |
| Deposition rate ($\mu$/h) | 2.0 | 2.2 | 1.9 | 2.8 | 1.8 |
| Electron diffraction | — | — | — | — | — |
| Raman peak position (cm$^{-1}$) | 1330 | 1345 | 1340 | 1325 | 1340 |
| Half band width (cm$^{-1}$) | 45 | 54 | 32 | 28 | 38 |
| Surface flatness [RMS (Å)] | 265 | 240 | 280 | 295 | 230 |
| Color | light yellow | colorless | light yellow | green | colorless |
| After repeating the heating cycle of room temperature⇌ 500° C. 200 times | no change | no change | no change | no change | no change |
| Electric resistance at room temperature ($\Omega \cdot$ cm) | 10$^2$ | 10$^6$ | 10$^7$ | 10$^{-2}$ | 10$^{11}$ |

What we claim is:

1. A single-bond carbonic film, matrix of which comprises carbon atoms and which is characterized by having a peak A at $1340\pm20$ cm$^{-1}$ and a peak B at $1580\pm10$ cm$^{-1}$ in Raman spectrum; a value of 9.7 or more for the ratio of $I_A/I_B$ between the intensity of said peak A($I_A$) and the intensity of said peak B($I_b$) and a value in the range of from 30 cm$^{-1}$ to 110 cm$^{-1}$ for the half band width of said peak A.

2. The single-bond carbon film according to claim 1, wherein a trace amount of one or more elements other than carbon atom.

3. The single-bond carbon film according to claim 2, wherein said element is a member selected from the group consisting of Si and Ge.

4. The single-bond carbon film according to claim 2, wherein said element is a member selected from the group consisting of N, P, As, B and Al.

5. The single-bond carbon film according to claim 2, wherein said element is a member selected from the group consisting of O, S, Se and Te.

6. The single-bond carbon film according to claim 2, wherein said element is a member selected from the group consisting of F, Cl, Br and I.

7. The single-bond carbon film according to claim 2, wherein said element is a member selected from the group consisting of He, Ne, Ar, Kr, Xe and Rn.

8. The single-bond carbon film according to claim 2, wherein said element is a member selected from the group consisting of H and Li.

9. The single-bond carbon film according to claim 2, wherein said element is a member selected from the group consisting of Sc, Y and lanthanoids La through Lu excluding Pm.

10. The single-bond carbon film according to claim 2, wherein said element is a member selected from the group consisting of alkali metals excluding Li and alkaline earth metals.

11. The single-bond carbon film according to claim 2, wherein said element is a member selected from the group consisting of Fe, Mn and Ni.

* * * * *

UNITED STATES PATENT AND TRADEMARK OFFICE
CERTIFICATE OF CORRECTION

PATENT NO. : 4,932,331
DATED : June 12, 1990
INVENTOR(S) : NORIKO KURIHARA, ET AL.

It is certified that error appears in the above-identified patent and that said Letters Patent is hereby corrected as shown below:

On the title page

IN [56] REFERENCES CITED

OTHER PUBLICATIONS, "Diamomd"" should read --Diamond"-- and "wandie" should read --wandte--.

COLUMN 1

Line 38, "amorphous" should read --amorphous are known--.
Line 39, "are known" should be deleted.
Line 56, "used" should read --used in--.

COLUMN 4

Line 50, "peak $B(I_b)$" should read --peak $B(I_B)$--.

COLUMN 5

Line 18, "distatisfaction" should read --dissatisfaction--.

COLUMN 8

Line 32, "suppling" should read --supplying--.

COLUMN 12

Line 37, "in to" should read --into--.

COLUMN 13

Line 29, "100 times." should be deleted.

UNITED STATES PATENT AND TRADEMARK OFFICE
CERTIFICATE OF CORRECTION

PATENT NO. : 4,932,331

DATED : June 12, 1990

INVENTOR(S) : NORIKO KURIHARA, ET AL.

Page 2 of 2

It is certified that error appears in the above-identified patent and that said Letters Patent is hereby corrected as shown below:

COLUMN 14

Line 26, "Mg-ribon" should read --Mg-ribbon--.
    Line 58, "field" should read --field:--.
    Line 63, "position" should read --position:--.

COLUMN 15

Line 1, "period" should read --period:--.

COLUMN 16

TABLE 2, "applied (tesra)" should read --applied (tesla)-- and "crystalinity" should read --crystallinity--.

COLUMN 17

Line 7, "peak $B(I_b)$" should read --peak $B(I_B)$--.
    Line 11, "wherein" should read --including--.

Signed and Sealed this

Eighteenth Day of August, 1992

Attest:

DOUGLAS B. COMER

Attesting Officer    Acting Commissioner of Patents and Trademarks